(12) United States Patent
Sato

(10) Patent No.: US 11,909,412 B2
(45) Date of Patent: Feb. 20, 2024

(54) FAILURE DETERMINATION DEVICE, CONTROL DEVICE, AND FAILURE DETERMINATION METHOD

(71) Applicant: HONDA MOTOR CO., LTD., Tokyo (JP)

(72) Inventor: Yasunari Sato, Tokyo (JP)

(73) Assignee: HONDA MOTOR CO., LTD., Tokyo (JP)

(*) Notice: Subject to any disclaimer, the term of this patent is extended or adjusted under 35 U.S.C. 154(b) by 0 days.

(21) Appl. No.: 18/153,549

(22) Filed: Jan. 12, 2023

(65) Prior Publication Data

US 2023/0304454 A1 Sep. 28, 2023

(30) Foreign Application Priority Data

Feb. 4, 2022 (JP) .................. 2022-016311

(51) Int. Cl.
*H03M 1/10* (2006.01)
*F02D 41/22* (2006.01)
*F02D 41/28* (2006.01)
*G01N 27/407* (2006.01)

(52) U.S. Cl.
CPC ........ *H03M 1/1085* (2013.01); *F02D 41/222* (2013.01); *F02D 41/28* (2013.01); *G01N 27/407* (2013.01); *F02D 2041/224* (2013.01); *F02D 2041/286* (2013.01)

(58) Field of Classification Search
CPC .. F02D 41/222; F02D 41/28; F02D 2041/286; G01N 27/407; H03M 1/1076; H03M 1/1085
See application file for complete search history.

(56) References Cited

U.S. PATENT DOCUMENTS 6,278,390 B1* 8/2001 Meyer ................ H03M 1/1076
341/118
2021/0396702 A1* 12/2021 Higuchi ............... F02D 41/222

FOREIGN PATENT DOCUMENTS

WO 2020/189380 A1 9/2020

* cited by examiner

*Primary Examiner* — Hung Q Nguyen
*Assistant Examiner* — Mark L. Greene
(74) *Attorney, Agent, or Firm* — Rankin, Hill & Clark LLP

(57) ABSTRACT

A failure determination device: acquires a second digital value indicating a difference between an analog electrical output generated by inputting a first digital value incremented at a first time interval to a DA conversion circuit and a target output indicated by the first digital value at a second time interval; and determines whether the DA conversion circuit has a failure based on a signal strength in a predetermined frequency of the second digital value that is a discrete signal.

10 Claims, 7 Drawing Sheets

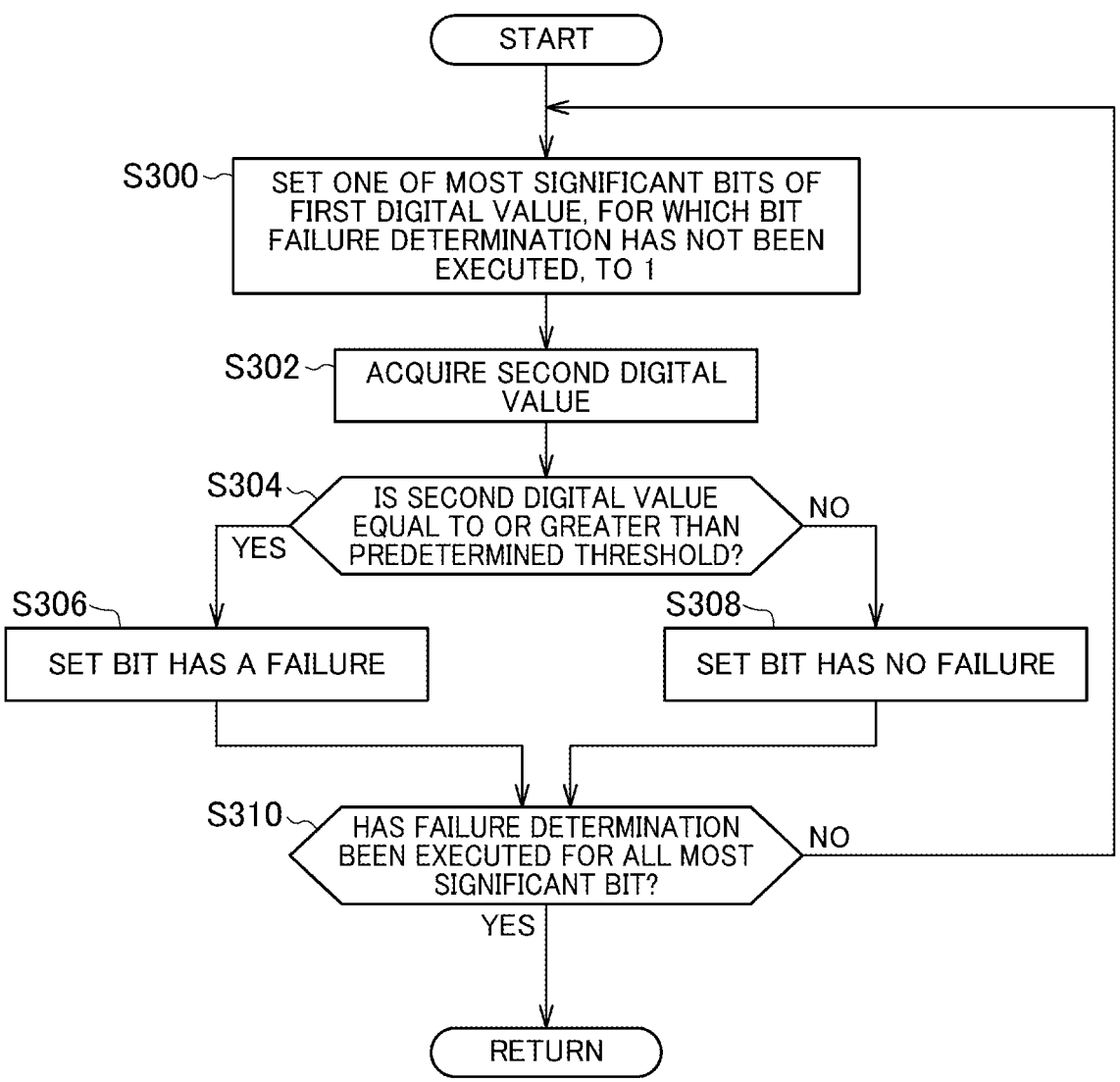

FAILURE DETERMINATION DEVICE, CONTROL DEVICE, AND FAILURE DETERMINATION METHOD

INCORPORATION BY REFERENCE

The present application claims priority under 35 U.S.C. § 119 to Japanese Patent Application No. 2022-016311 filed on Feb. 4, 2022. The content of the application is incorporated herein by reference in its entirety.

BACKGROUND OF THE INVENTION

Field of the Invention

The present invention relates to a failure determination device of a digital-to-analog conversion circuit (DA conversion circuit), a control device, and a failure determination method of a DA conversion circuit.

Description of the Related Art

International Publication No. WO 2020189380 discloses a configuration for diagnosing a failure of a DA conversion circuit in a gas sensor system. The gas sensor system has a DA conversion circuit that outputs pump current to the pump cell that receives a digital signal under the condition that oxygen ion conductivity does not occur in the pump cell of the gas sensor. At this time, the gas sensor system compares the voltage, which is applied to the diagnostic resistor connected in parallel with the pump cell, with a threshold, and thereby determines whether the DA conversion circuit has a failure.

A DA conversion circuit of a current output type generally includes current sources corresponding to individual bits of input digital data, and adds the currents from all the current sources each corresponding to each bit set in the input digital data and thereby generates the output current. In this case, if the DA conversion circuit has a failure mode that has, for example, a failure only at the current source corresponding to the least significant bit (LSB) of the input digital data, the DA conversion circuit has the output current having a deviation from the target output current due to this failure but the deviation is at the same level as the quantization error of the DA conversion circuit. For example, in a 12-bit DA conversion circuit with a maximum output current of 8 mA, the output current has a deviation of about 1 µA due to the failure of the current source corresponding to the LSB. Even in the case of a failure with respect to the second LSB bit of the input digital data, the deviation from the target current is about several µA that is very small.

Thus, in the conventional gas sensor system described above, in which a failure of the DA conversion circuit is detected from a comparison between the voltage generated in the diagnostic resistor and the threshold, the determination accuracy that can be realized by the comparison circuit used for the above comparison can lead to a very difficult detection of the deviation in the output current caused by the failure in the least significant bits of the input digital data, as described above.

An object of the present invention is to accurately detect failures in DA conversion circuits.

The object can lead to improvement of energy efficiency in society as a whole through, for example, improvement of accuracy in failure determination in DA conversion circuits in a digital control devices that control combustion efficiency of internal combustion engines, and can contribute to achievement of the Sustainable Development Goals (SDG 7.3, 9.4).

SUMMARY OF THE INVENTION

An aspect of the present invention is a failure determination device including: an output unit that inputs a first digital value to a digital-to-analog conversion circuit (DA conversion circuit) and causes the DA conversion circuit to generate an analog electrical output; an acquisition unit that acquires a second digital value corresponding to a difference between the analog electrical output of the DA conversion circuit and a target analog electrical output indicated by the first digital value; and a diagnosis unit that diagnoses a failure of the DA conversion circuit based on the second digital value, wherein the output unit increments the first digital value and inputs the first digital value to the DA conversion circuit at a first time interval, the acquisition unit acquires the second digital value at a second time interval that is shorter than the first time interval, and the diagnosis unit determines whether the DA conversion circuit has a failure, based on signal strength of an alternating-current component (AC component) with a predetermined frequency included in a discrete signal that is the second digital value acquired at the second time interval.

According to another aspect of the present invention, the acquisition unit: samples the analog electrical output of the DA conversion circuit at the second time interval, to acquire the analog electrical output as a third digital value; and calculates the second digital value from a difference between the first digital value and the third digital value, and acquires the second digital value.

According to yet another aspect of the present invention, the diagnosis unit multiplies the discrete signal by a predetermined periodic function to calculate an enhanced signal strength of the AC component with the predetermined frequency, and the periodic function is a function that repeatedly takes three values of −1, 0, and +1 in sequence in one period.

According to yet another aspect of the present invention, the predetermined frequency is at least one frequency corresponding to a period obtained by multiplying the first time interval by a power of 2.

According to yet another aspect of the present invention, the predetermined frequency is a frequency corresponding to a period obtained by multiplying the first time interval by 2, and the diagnosis unit determines whether there is an operational failure with respect to a least significant bit of input digital data in the DA conversion circuit.

According to yet another aspect of the present invention, the predetermined frequency is a frequency corresponding to a period obtained by multiplying the first time interval by 4, and the diagnosis unit determines whether there is an operational failure with respect to a second least significant bit of input digital data in the DA conversion circuit.

According to yet another aspect of the present invention, the output unit sequentially sets only one of significant bits to 1, the significant bits being bits excluding a predetermined number of least significant bits of the first digital value that is a binary value, the acquisition unit acquires the second digital value when the output unit sets only one of the significant bits to 1, and the diagnosis unit determines that an operational failure has occurred with respect to the bit set to 1 in the DA conversion circuit when the second digital value acquired by the acquisition unit is equal to or greater than a predetermined threshold determined corresponding to the first digital value.

According to yet another aspect of the present invention, the DA conversion circuit is a circuit to be used to generate a pump current that energizes a pump cell of an air-fuel ratio sensor.

Yet another aspect of the present invention is a control device including any of the above failure determination devices.

Yet another aspect of the present invention is a failure determination method for a DA conversion circuit executed by a computer of a failure determination device, the method including: a step of inputting a first digital value to the DA conversion circuit and causing the DA conversion circuit to generate an analog electrical output; a step of acquiring a second digital value corresponding to a difference between the analog electrical output of the DA conversion circuit and a target analog electrical output indicated by the first digital value; and a step of diagnosing a failure of the DA conversion circuit based on the second digital value, wherein the step of inputting increments the first digital value and input the incremented value to the DA conversion circuit at a first time interval, the step of acquiring acquires the second digital value at a second time interval, the second time interval being shorter than the first time interval, and the step of diagnosing determines whether the DA conversion circuit has a failure based on signal strength of an AC component with a predetermined frequency included in a discrete signal, the discrete signal being the second digital value acquired at the second time interval.

According to the aspects of the present invention, it is possible to accurately detect failures in the DA conversion circuit.

BRIEF DESCRIPTION OF THE DRAWINGS

FIG. 7 is a flowchart showing a procedure of significant bit determination processing shown in FIG. 5.

DETAILED DESCRIPTION OF THE PREFERRED EMBODIMENTS

Hereinafter, embodiments of the present invention will be described with reference to the drawings.

Figure 1:
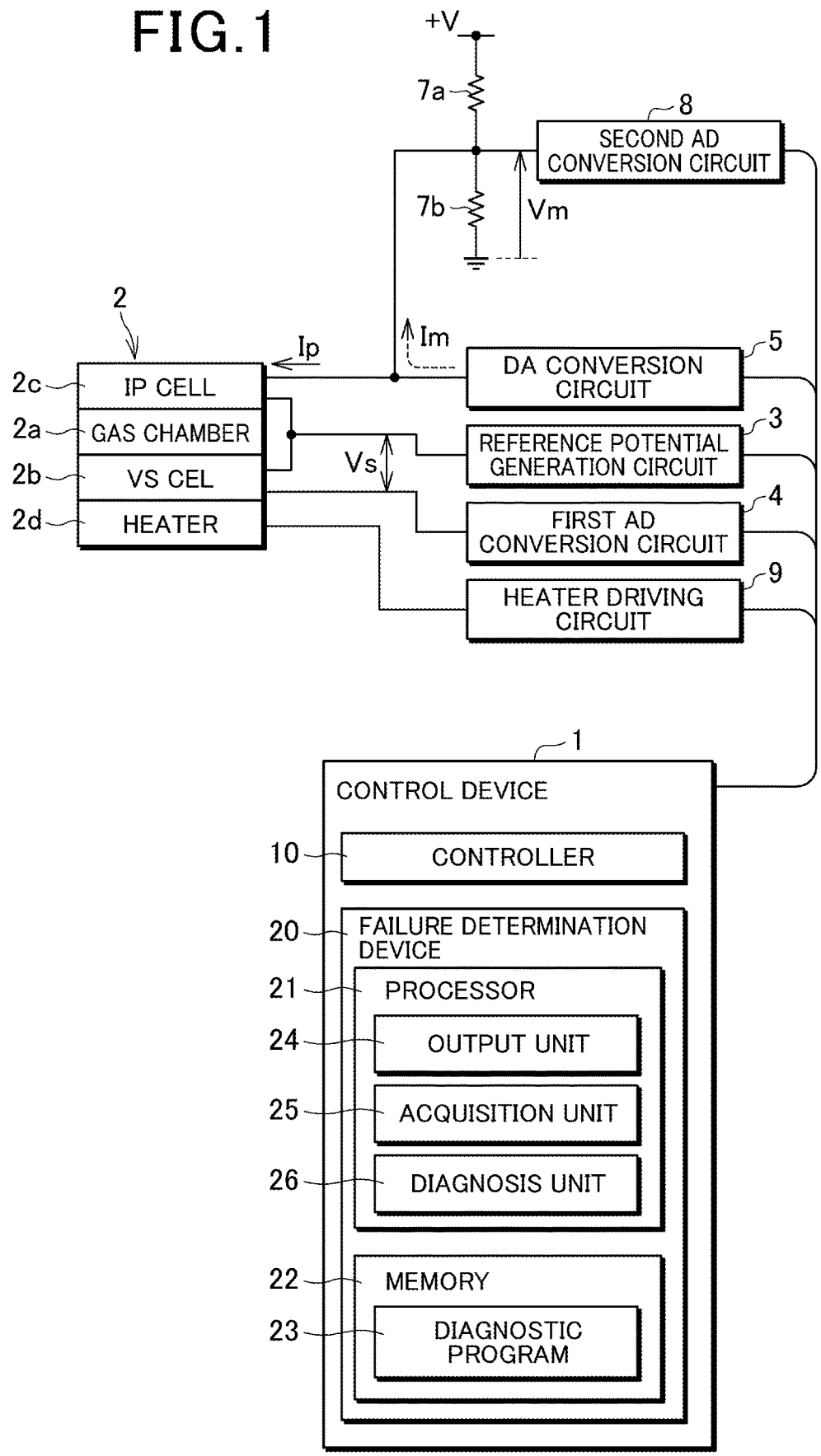
FIG. 1 is a diagram showing a configuration of a control device including a failure determination device for a DA conversion circuit according to an embodiment of the present invention.

FIG. 1 is a diagram showing a configuration of a control device including a failure determination device of a DA conversion circuit according to the present embodiment.

A control device 1 detects an air-fuel ratio of an internal combustion engine (not shown) of a vehicle with an air-fuel ratio sensor 2 provided in the internal combustion engine. The air-fuel ratio sensor 2 is arranged inside an exhaust pipe of the vehicle. According to conventional techniques, the air-fuel ratio sensor 2 includes: a gas chamber 2a into which the air in the exhaust pipe of the internal combustion engine is introduced; a VS cell 2b that generates a voltage Vs corresponding to an oxygen concentration in the gas chamber 2a; and an IP cell 2c that is energized to discharge oxygen in the gas chamber 2a. The air-fuel ratio sensor 2 also includes a heater 2d that heats the gas chamber 2a, the VS cell 2b, and the IP cell 2c.

When the IP cell 2c is energized, the IP cell 2c discharges oxygen in the gas chamber 2a to the outside at a rate corresponding to the current flowing therethrough (Ip current). The gas chamber 2a has a ventilation lid (not shown) made of a porous material through which oxygen flows into the gas chamber 2a from the exhaust pipe at a rate corresponding to the oxygen concentration difference between the inside of the exhaust pipe and the inside of the gas chamber 2a when the IP cell 2c discharges oxygen from the gas chamber 2a.

According to the conventional technique, the air-fuel ratio of the internal combustion engine is detected in such a way that the Ip current is controlled so that the electromotive voltage Vs in the VS cell 2b becomes a predetermined target value and then the Ip current is measured when reaching a constant value in a predetermined time.

In FIG. 1, a reference potential generation circuit 3 gives a common reference potential to the VS cell 2b and the IP cell 2c according to instructions from the control device 1. A first analog-to-digital conversion circuit (AD conversion circuit) 4 samples the Vs voltage, which is the electromotive voltage of the VS cell 2b, at predetermined time intervals, converts the sampled Vs voltage into a digital value, and transmits the digital value to the control device 1. A DA conversion circuit 5 is of a current output type, and outputs a current, which is an analog electrical output, based on the first digital value received from the control device 1. The output current flows through the IP cell 2c of the air-fuel ratio sensor 2 as the Ip current. Also, the current output from the DA conversion circuit 5 flows to a resistor 7b as a monitoring current Im.

Resistors 7a and 7b generate a monitoring voltage Vm corresponding to the monitoring current Im output from the DA conversion circuit 5 and output the monitoring voltage Vm to a second AD conversion circuit 8. The second AD conversion circuit 8 samples the monitoring voltage Vm generated across the resistor 7b at predetermined time intervals, converts the sampled monitoring voltage Vm into a digital value, and outputs the digital value to the control device 1. A heater driving circuit 9 energizes the heater 2d to heat the gas chamber 2a, the VS cell 2b, and the IP cell 2c.

The bit lengths of the input digital data (binary value) of the DA conversion circuit 5 and the output digital data (binary value) of the second AD conversion circuit 8 are, for example, 12 bits.

The control device 1 has a controller 10 and a failure determination device 20.

The controller 10 includes, for example, a processor and a memory (not shown). The controller 10 instructs the reference potential generation circuit 3 to apply the reference potential to the VS cell 2b and the IP cell 2c, and instructs the heater driving circuit 9 to heat the VS cell 2b, the gas chamber 2a, and the IP cell 2c with the heater 2d.

According to the conventional technique, the controller 10 outputs the Ip current, which flows through the IP cell 2c, from the DA conversion circuit 5 with digital proportional-integral-differential control (digital PID control), so that the electromotive voltage Vs of the VS cell 2b, acquired via the first AD conversion circuit 4, is a predetermined constant voltage (for example, 450 mV). The controller 10 detects the air-fuel ratio from the Ip current when the Ip current flowing through the IP cell 2c reaches a constant value within a predetermined error range.

The failure determination device 20 determines whether the DA conversion circuit 5 has a failure while the air-fuel ratio sensor 2 does not detect the air-fuel ratio, for example, while the internal combustion engine provided with the air-fuel ratio sensor 2 is stopped for a predetermined time or longer.

In the present embodiment, the failure mode of the DA conversion circuit 5 determined by the failure determination device 20 is operational abnormality with respect to each bit of the input digital data in the DA conversion circuit 5. The operational abnormality with respect to each bit (hereinafter referred to as a bit failure) means, for example, operational abnormality with respect to each current source provided inside the DA conversion circuit 5 corresponding to each bit.

The bit failures include a failure (on-failure) in which the current of the current source corresponding to a bit is always output from the DA conversion circuit 5, and a failure (off-failure) in which no current of the current source corresponding to a bit is always output from the DA conversion circuit 5, regardless of whether each bit in the input digital data is 1 or 0.

Hereafter, the least significant bit is referred to as bit 0, and the adjacent bits such as the second, third, and fourth least significant bits are sequentially referred to as bit 1, bit 2, bit 3, and so on. Therefore, the most significant bit is bit 11.

In a general DA conversion circuit, as the bit of input digital data varies from less significant bit to more significant bit, the current output from the corresponding current source increases. Therefore, a bit failure at several or more bits away from the least significant bit has a large difference between the target current and the actual output current. This makes it possible to determine whether there is a failure based on whether the difference is equal to or greater than a threshold. In contrast, a bit failure in several least significant bits including the least significant bit causes the difference between the target current and the actual output current to be so small to approach the noise level. This makes it difficult to determine whether there is a failure based on whether the difference is equal to or greater than the threshold.

Therefore, in the present embodiment, the failure determination device 20 determines whether there is any bit failure, in particular, with respect to the several least significant bits in the input digital data of the DA conversion circuit 5, based on strength of the alternating-current component (AC component) included in the time change of the difference between the analog electrical output of the DA conversion circuit 5 and the target electrical output while the input digital data of the DA conversion circuit 5 are incremented at predetermined time intervals.

Specifically, the failure determination device 20 executes: less significant bit determination processing in which the failure determination is performed with respect to the two least significant bits of the input digital data of the DA conversion circuit 5, in other words, with respect to bit 0 and bit 1 of the data; and significant bit determination processing in which the failure determination is performed with respect to the ten more significant bits of the data.

In the less significant bit determination processing, the failure determination device 20 performs the failure determination based on the strength of the AC component of the difference between the analog electrical output of the DA conversion circuit 5 and the target electrical output while the input digital data of the DA conversion circuit 5 are incremented at predetermined time intervals.

In the significant bit determination processing, the failure determination device 20 sequentially sets only one of the most significant bits to 1, and determines whether there is a bit failure with respect to the bit set to 1 based on whether the difference between the analog electrical output of the DA conversion circuit 5 and the target electrical output is equal to or greater than a predetermined threshold.

With reference to FIG. 1, the failure determination device 20 has a processor 21 and a memory 22.

The memory 22 is composed of, for example, a volatile and/or non-volatile semiconductor memory. The memory 22 stores a diagnostic program 23 to be executed by the processor 21 of failure determination device 20.

The processor 21 is, for example, a computer including a processor such as a central processing unit (CPU). The processor 21 may have a read only memory (ROM) in which programs are written, a random access memory (RAM) for temporarily storing data, and the like. The processor 21 includes an output unit 24, an acquisition unit 25, and a diagnosis unit 26 as functional elements or functional units.

These functional elements included by the processor 21 are implemented by the processor 21, which is a computer, executing the diagnostic program 23, for example. The diagnostic program 23 can be stored in any computer-readable storage medium. Alternatively, the diagnostic program 23 and/or its updated program can be downloaded from a server outside the vehicle via a communication device (not shown) provided in the vehicle in which the control device 1 is installed, according to conventional techniques. Instead of these, all or part of the functional elements included in the processor 21 may be configured with hardware including one or more electronic circuit components.

For example, while the internal combustion engine provided with the air-fuel ratio sensor 2 is stopped for a predetermined time or longer, the output unit 24 notifies the acquisition unit 25 and the diagnosis unit 26 of the start of the less significant bit determination processing of the DA conversion circuit 5. When the internal combustion engine starts operating, for example, the output unit 24 notifies the acquisition unit 25 and the diagnosis unit 26 of the stop of the failure determination operation. For example, according to conventional techniques, the output unit 24 can receive information about the on/off state of the ignition switch of the vehicle from the electronic control device of the vehicle in which the control device 1 is installed, to determine whether the internal combustion engine stops for a predetermined time or longer or whether the internal combustion engine has started operation.

After notification of the start of less significant bit determination processing, the output unit 24 inputs a first digital value, which is input digital data, to the DA conversion circuit 5, and causes the DA conversion circuit 5 to output the monitoring current Im, which is an analog electrical signal. Specifically, the output unit 24 increments the first digital value by +1 from 0 at a predetermined first time interval $\Delta t1$, and inputs the first digital value to the DA conversion circuit 5. Each time the DA conversion circuit 5 receive the first digital value, the DA conversion circuit 5 outputs a monitoring current Im corresponding to the input first digital value. The first time interval Δt1 is, for example, 40 ms. The output unit 24 also transmits the first digital value to the acquisition unit 25 at the same time as inputting the first digital value to the DA conversion circuit 5. Here, the first digital value is a binary value.

The output unit 24 also sequentially sets only one of the ten most significant bits of the first digital value, which is a binary value, to 1 in response to receiving a notification from the diagnosis unit 26 to start the significant bit determination processing. Upon setting one of the ten most significant bits to 1, the output unit 24 transmits the first digital value to the acquisition unit 25 and the diagnosis unit 26.

The acquisition unit 25 acquires a second digital value at a second time interval Δt2 that is shorter than the first time interval Δt1, in response to receiving the notification of the start of the less significant bit determination processing from the output unit 24. The second digital value corresponds to the difference between the monitoring current Im output by the DA conversion circuit 5 and the target current It that is a target analog electrical output indicated by the first digital value. The second time interval Δt2 is, for example, 10 ms.

Specifically, the acquisition unit 25 samples the monitoring voltage Vm, which is generated at the resistor 7b corresponding to the monitoring current Im of the DA conversion circuit 5, at the second time interval Δt2, with the second AD conversion circuit 8. The acquisition unit 25 then acquires the value of the sampled monitoring voltage Vm as a third digital value. Subsequently, the acquisition unit 25 calculates and acquires the second digital value from the difference between the first digital value and the third digital value. Here, according to conventional techniques, adjustment of the conversion coefficient from the monitoring voltage Vm to the third digital value, offset correction of the third digital value, etc. can be performed through adjustment of the resistance value of the resistor 7b, addition operation of the offset value to the third digital value, or the like.

The second digital value acquired at the second time interval is a value corresponding to the difference between the monitoring current Im output by the DA conversion circuit 5 corresponding to the first digital value and a target current It indicated by the first digital value. Therefore, the value does not change except for noise components if the operation of the DA conversion circuit 5 is normal. In contrast, if the DA conversion circuit 5 has a failure and does not output the monitoring current Im corresponding to the first digital value, the second digital value changes in a rectangular wave over time, corresponding to the location of the bit failure in the DA conversion circuit 5 and the timing of incrementing the first digital value.

In response to receiving a notification from the diagnosis unit 26 to start the significant bit determination processing, the acquisition unit 25 also acquires a second digital value corresponding to the difference between the monitoring current Im, output by the DA conversion circuit 5, and the target current It when the diagnosis unit 26 receives the first digital value from the output unit 24. Like the second digital value in the less significant bit determination processing described above, the second digital value acquired at this time can also be calculated from the difference between: the third digital value acquired from the second AD conversion circuit 8 when the acquisition unit 25 receives the first digital value from the output unit 24; and the first digital value.

The diagnosis unit 26 determines whether there is a bit failure with respect to the two least significant bits of the DA conversion circuit 5 in response to receiving the notification of the start of the less significant bit determination processing from the output unit 24. Specifically, the diagnosis unit 26 determines a bit failure in each of the two least significant bits of the DA conversion circuit 5 based on the signal strength of the AC component with the predetermined frequency included in the discrete signal indicated by the second digital value acquired by the acquisition unit 25 at the second time interval Δt2.

The predetermined frequency is a frequency corresponding to a period obtained by multiplying the first time interval Δt1 by a power of two, $2^n$ (n is a natural number). In the present embodiment, the frequencies are two frequencies corresponding to periods of $2^1$ and $2^2$ times the first time interval Δt1, respectively.

As described above, the output unit 24 increments the first digital value by +1 at the first predetermined time interval. Therefore, if the DA conversion circuit 5 is normal, the output current of the current source corresponding to bit 0 is output from the DA conversion circuit 5 with a period of $Δt1×2^1$ (consisting of a cycle of 0 and 1). Further, if the DA conversion circuit 5 is normal, the output current of the current source corresponding to bit 1 is output from the DA conversion circuit 5 with a period of $Δt1×2^2$ (consisting of a cycle of 00, 01, 10, and 11). Similarly, the output currents of the current sources corresponding to bit 2 and bit 3 are output from the DA conversion circuit 5 with periods of $Δt1×2^3$ and $Δt1×2^4$, respectively.

Therefore, if a bit failure at bit 0 (hereinafter referred to as bit 0 failure) occurs in the DA conversion circuit 5, the second digital value corresponding to the difference between the monitoring current Im of the DA conversion circuit 5 and the target current It changes with a period of $Δt1×2^1$. If a bit failure occurs at bit 1 in the DA conversion circuit 5, the second digital value changes with a period of $Δt1×2^2$.

Thus, the discrete signals indicated by the second digital value acquired at the second time interval Δt2 have an increased signal strength of the AC component with frequency $F1=1/(Δt1×2^1)$ Hz corresponding to the period of $Δt1×2^1$ in the case of bit 0 failure. In the case of the bit 1 failure, the discrete signals have an increased signal strength of the AC component with the frequency $F2=1/(Δt1×2^2)$ Hz corresponding to the period of $Δt1×2^2$.

Thus, the diagnosis unit 26 determines a bit 0 failure based on the signal strength of the AC component with the frequency F1 corresponding to the period of $Δt1×2^1$, which is included in the discrete signal indicated by the second digital value acquired at the second time interval. The diagnosis unit 26 also determines a bit 1 failure based on the signal strength of the AC component with the frequency F2 corresponding to the period of $Δt1×2^2$. Here, in the present embodiment, Δt1 is 40 ms, so F1 is 12.5 Hz and F2 is 6.25 Hz.

The diagnosis unit 26 determines that a bit 0 failure has occurred in the DA conversion circuit 5 when the signal strength with the F1 frequency is equal to or greater than a predetermined threshold. The diagnosis unit 26 also determines that a bit 1 failure has occurred in the DA conversion circuit 5 when the signal strength with the frequency of F2 is equal to or greater than a predetermined threshold.

Here, the signal strength of AC component with frequency t with respect to the discrete signal indicated by the second digital signal can be calculated, for example, by multiplying the above discrete signal by a trigonometric function according to the formula of discrete Fourier transformation indicated by Expression (1).

[Expression 1]

$$\text{Signal strength} = \sqrt{\left\{\sum_{x=0}^{N-1} f[x]\cos\left(-\frac{2\pi tx}{N}\right)\right\}^2 + \left\{j\sum_{x=0}^{N-1} f[x]\sin\left(-\frac{2\pi tx}{N}\right)\right\}^2} \quad (1)$$

Where: f(x) is the discrete data that is the second digital value acquired at the second time interval, x is the index of the discrete data, N is the number of data, and t is the frequency.

The diagnosis unit 26 can determine whether the bit 0 failure or the bit 1 failure occurs if any signal strength obtained from the above Expression (1) for a predetermined frequency t=12.5 Hz or t=6.25 Hz is equal to or greater than a predetermined threshold.

In the present embodiment, in order to enhance the signal strength particularly at the predetermined frequency, the diagnosis unit 26 does not multiply discrete data f(x) by the trigonometric function in Expression (1), and instead multiplies the discrete data f(x) of the second digital value by a predetermined periodic function E with a period of $2\pi$ that takes three values of $-1$, 0, and $+1$ repeatedly in sequence, as indicated in Expression (2).

[Expression 2]

$$\left.\begin{array}{l} \text{If } \cos\alpha \leq -y, \text{ then } E(\alpha) = -1 \\ \text{If } -y < \cos\alpha < y, \text{ then } E(\alpha) = 0 \\ \text{If } y \leq \cos\alpha, \text{ then } E(\alpha) = 1 \\ \text{where } 0 < y < 1 \end{array}\right\} \quad (2)$$

In other words, in the present embodiment, the diagnosis unit 26 calculates the signal strength with the following Expression (3).

[Expression 3]

$$\text{Signal strength} = \sqrt{\left\{\sum_{x=0}^{N-1} f[x]E\left(-\frac{2\pi tx}{N}\right)\right\}^2 + \left\{\sum_{x=0}^{N-1} f[x]E\left(-\frac{2\pi tx}{N} - \frac{\pi}{2}\right)\right\}^2} \quad (3)$$

The value of y in Expression (2) is 0.3 in the present embodiment. However, this is just an example, and the value of y can be any value that can enhance the signal strength at the frequency of interest, depending on how the discrete data f(x) changes over time.

Figure 2:
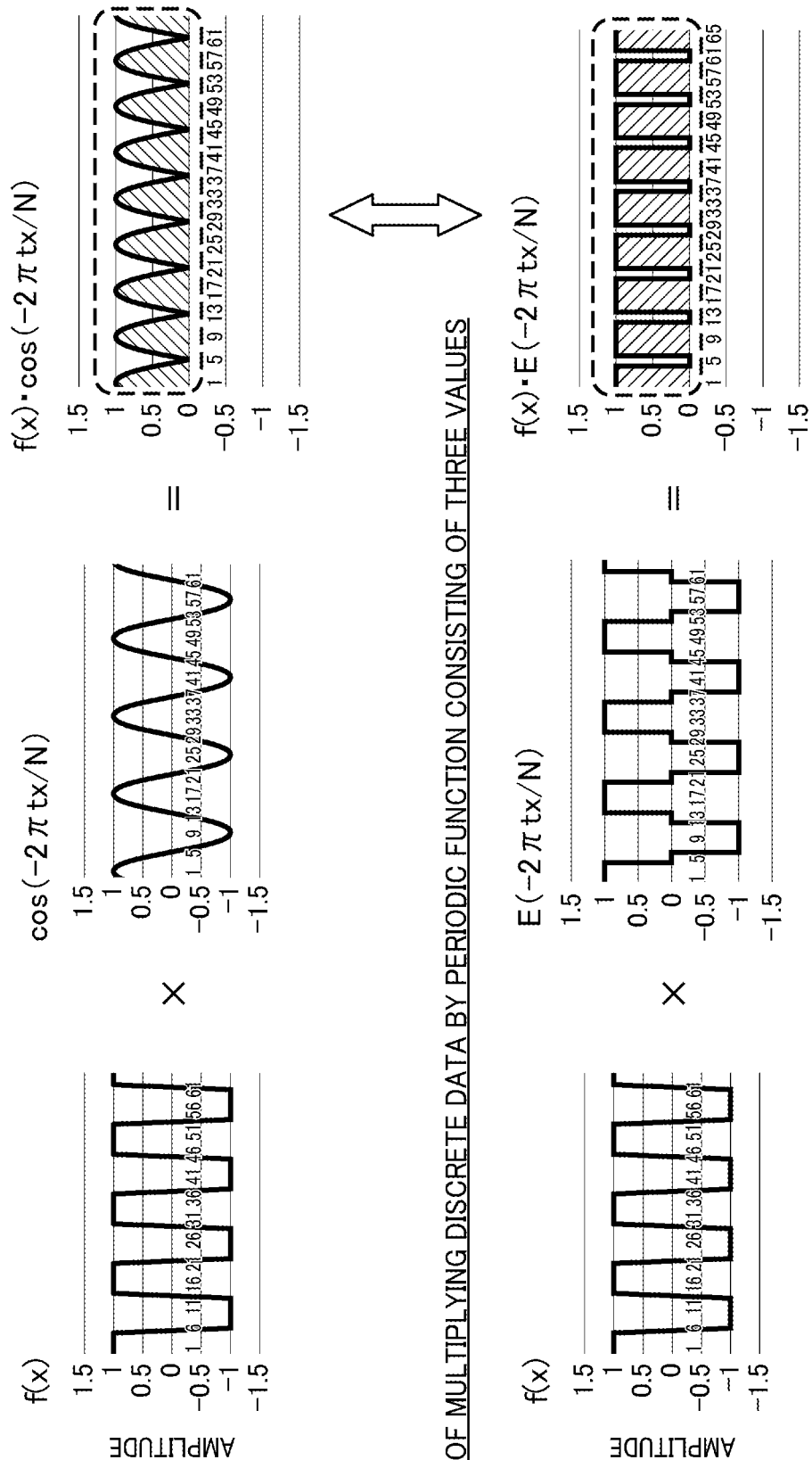
FIG. 2 is an explanatory diagram for explaining enhancement of signal strength at a predetermined frequency.

FIG. 2 is an explanatory diagram for explaining the enhancement of the signal strength with a periodic function E that takes three values. The upper part of the figure shows an example of multiplying the discrete data indicated by the second digital value by a cosine function, which is a trigonometric function. The lower part of the drawing shows an example of multiplying the discrete data indicated by the second digital value by the periodic function E indicated in Expression (2). In the upper part of the figure, the graph on the left side is the discrete data indicated by the second digital value, the graph in the middle is the cosine function to be multiplied, and the graph on the right side is the graph showing the multiplication result. In the lower part of the figure, the graph on the left side is the discrete data indicated by the second digital value, the graph in the middle is the periodic function E to be multiplied, and the graph on the right side is the graph showing the multiplication result.

In the multiplication result shown on the right side of the figure, there are the following two areas of the regions each surrounded by the multiplication result graph and the axis of value 0: an area in the case of multiplying the cosine function shown in the upper middle part of the figure; and an area in the case of multiplying a periodic function E, which is close to the rectangular wave, shown in the lower middle part of the figure. In these two areas, the latter is larger than the former because the f(x), which indicates the second digital value, has a shape close to a rectangular wave in the present embodiment. Therefore, for example, the sum of the first terms in the radical sign in Expression (3) is greater than the sum of the first terms in the radical sign in Expression (1). As a result, the signal strength calculated by Expression (3) is enhanced relative to the signal strength calculated by Expression (1).

The diagnosis unit 26 also transmits a notification of the start of the significant bit determination processing, to the output unit 24, when the diagnosis unit 26 completes the failure determination with respect to the two least significant bits of the DA conversion circuit by the above-described processing. When the diagnosis unit 26 receives the first digital value from the output unit 24 after transmitting notification of the start of the significant bit determination processing, the diagnosis unit 26 also determines whether the second digital value acquired by the acquisition unit 25 is equal to or greater than a predetermined threshold determined corresponding to the received first digital value. Then, when the second digital value is equal to or greater than the threshold, the diagnosis unit 26 determines that a bit failure has occurred in the DA conversion circuit 5 with respect to the bit set to 1 in the received first digital value.

After the diagnosis unit 26 determines whether there is a bit failure with respect to all the most significant bits in the significant bit determination processing, the diagnosis unit 26 transmits a notification of the end of the failure determination processing, to the output unit 24 and the acquisition unit 25.

Next, an operation example in the less significant bit determination processing will be described.

Figure 3:
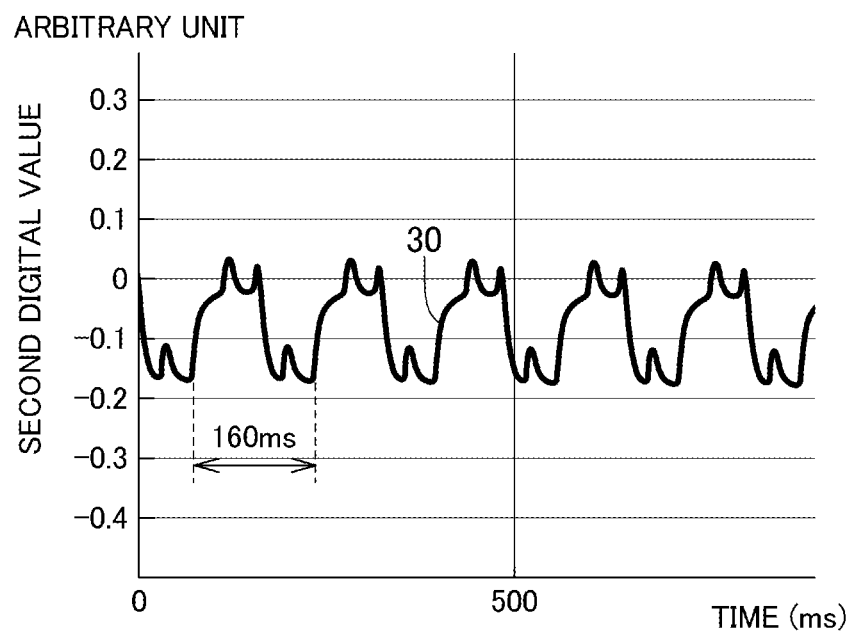
FIG. 3 is a graph showing an example of a sampling result of a second digital value in less significant bit determination processing.

FIG. 3 is a graph showing an example of the sampling result of the second digital value in the less significant bit determination processing when bit 1 has an on-failure and the other bits are normal. In FIG. 3, a waveform 30 is an approximate waveform of the sampling result of the second digital value. Actually, 160 ms periods each have 16 sampled second digital values at equal second time intervals $\Delta t2=10$ ms.

Figure 4:
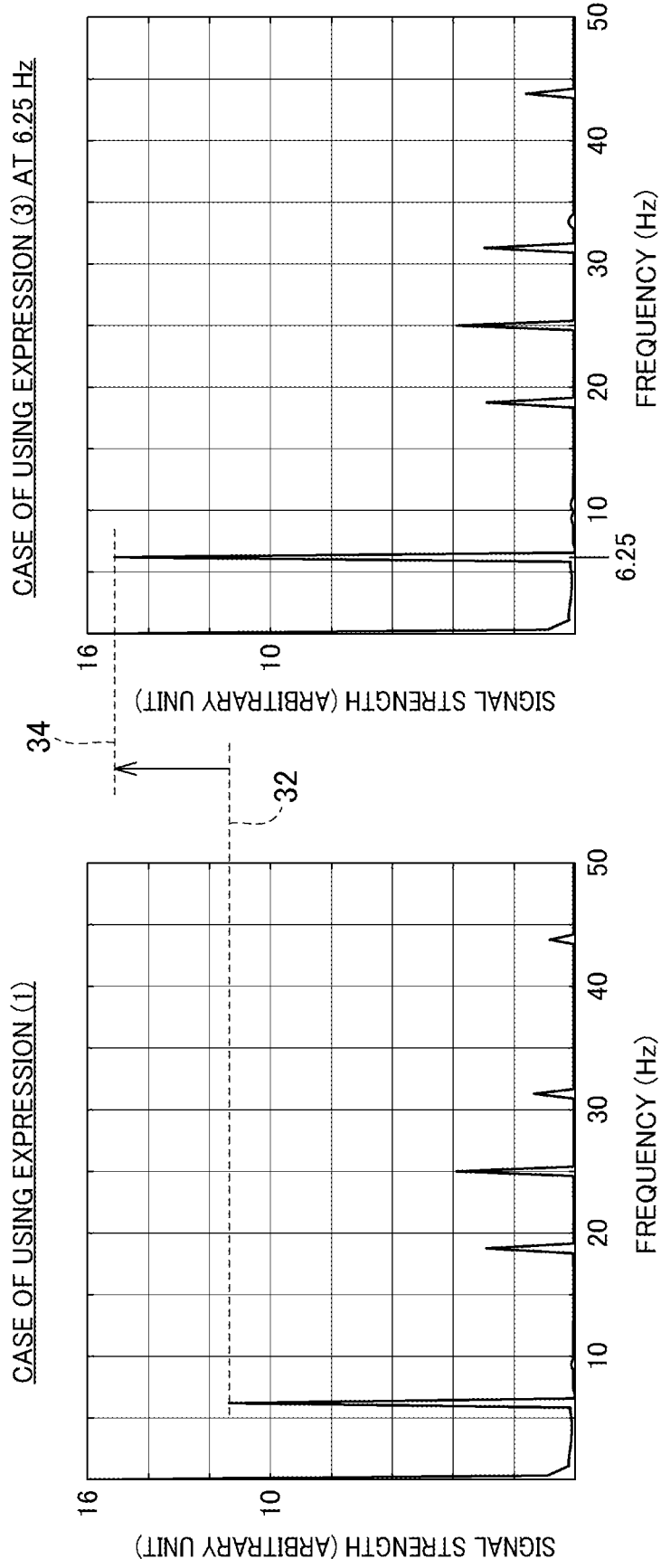
FIG. 4 is a diagram showing an example of a result of calculating frequency spectra with respect to discrete data of a second digital value.

FIG. 4 shows calculation results of the frequency spectrum with respect to the discrete data of the second digital values forming the waveform 30 shown in FIG. 3. The graph on the left side of the figure is the result of calculating the frequency spectrum with Expression (1). The graph on the right side of the figure is the result of calculating the frequency spectrum when Expression (3) is used only for the frequency of 6.25 Hz corresponding to the bit 1 failure. As shown by two horizontal lines 32 and 34 in FIG. 4, the signal strength (spectrum peak value) at the frequency 6.25 Hz corresponding to the bit 1 failure is larger in the right part of the figure with Expression (3) than in the left part of the figure with Expression (1). Therefore, determination of a bit 1 failure based on the signal strength at the frequency of 6.25 Hz can be made more accurately with Expression (3).

In FIG. 4, the signal strength is calculated with respect to the entire frequency range up to 50 Hz. However, the diagnosis unit 26 just needs to calculate the signal strength only for the frequencies of 12.5 Hz and 6.25 Hz corresponding to bit 0 failure and bit 1 failure, respectively.

In the less significant bit determination processing, the failure determination device 20 having the above configuration does not analyze the AC component of the discrete signal indicated by the second digital value for the entire given frequency range. Instead, the failure determination device 20 uses only the signal strength of the AC component with the predetermined frequency corresponding to the predetermined bit of the input digital data of the DA conversion circuit 5 (in the present embodiment, for example, bit 0 and bit 1), to enable detection of a bit failure in the DA conversion circuit 5. For this reason, the failure determination device 20 can accurately detect a fault in the less significant bits of the DA conversion circuit 5 with a small arithmetic processing load.

In addition, when the failure determination device 20 calculates the signal strength of the predetermined frequency included in the discrete signal indicated by the second digital value, the failure determination device 20 multiplies the discrete data, indicated by the second digital value, by a predetermined periodic function E that has a period of 2× and takes three values of −1, 0, and +1, instead of a trigonometric function, and thereby enhances the signal strength at the predetermined frequency. For this reason, the failure determination device 20 can detect the failure of the less significant bits of the DA conversion circuit 5 with higher accuracy.

Figure 5:
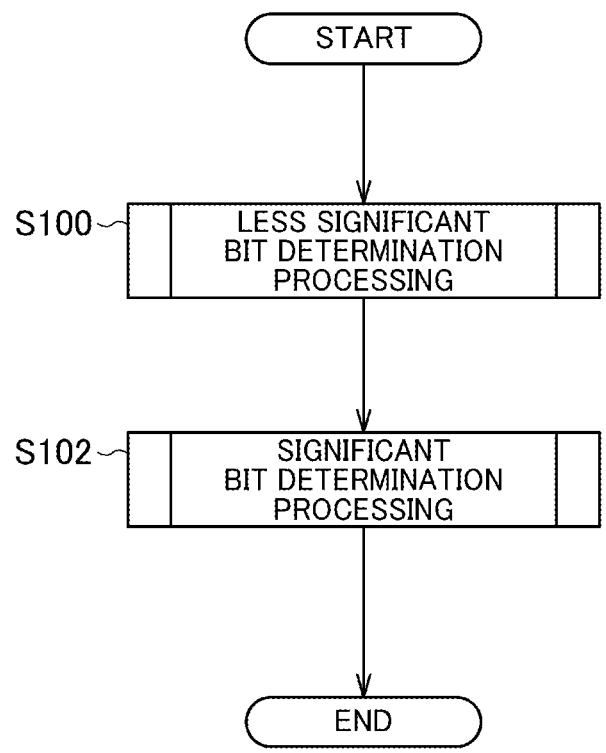
FIG. 5 is a flowchart showing an operation procedure of failure determination processing in the failure determination device.

Next, the operation of failure determination processing in the failure determination device 20 will be described. FIG. 5 is a flowchart showing an example of failure determination processing. The processing shown in FIG. 5 starts when the output unit 24 detects that the internal combustion engine provided with the air-fuel ratio sensor 2 stops for a predetermined time or longer.

When the processing starts, the failure determination device 20 performs the less significant bit determination processing (S100) for performing failure determination with respect to the two least significant bits of the input digital data in the DA conversion circuit 5. The failure determination device 20 then performs the significant bit determination processing for performing failure determination with respect to the ten most significant bits (S102), and ends the processing. Here, if the internal combustion engine is started before the failure determination process ends, the failure determination device 20 terminates the failure determination process at that time.

Figure 6:
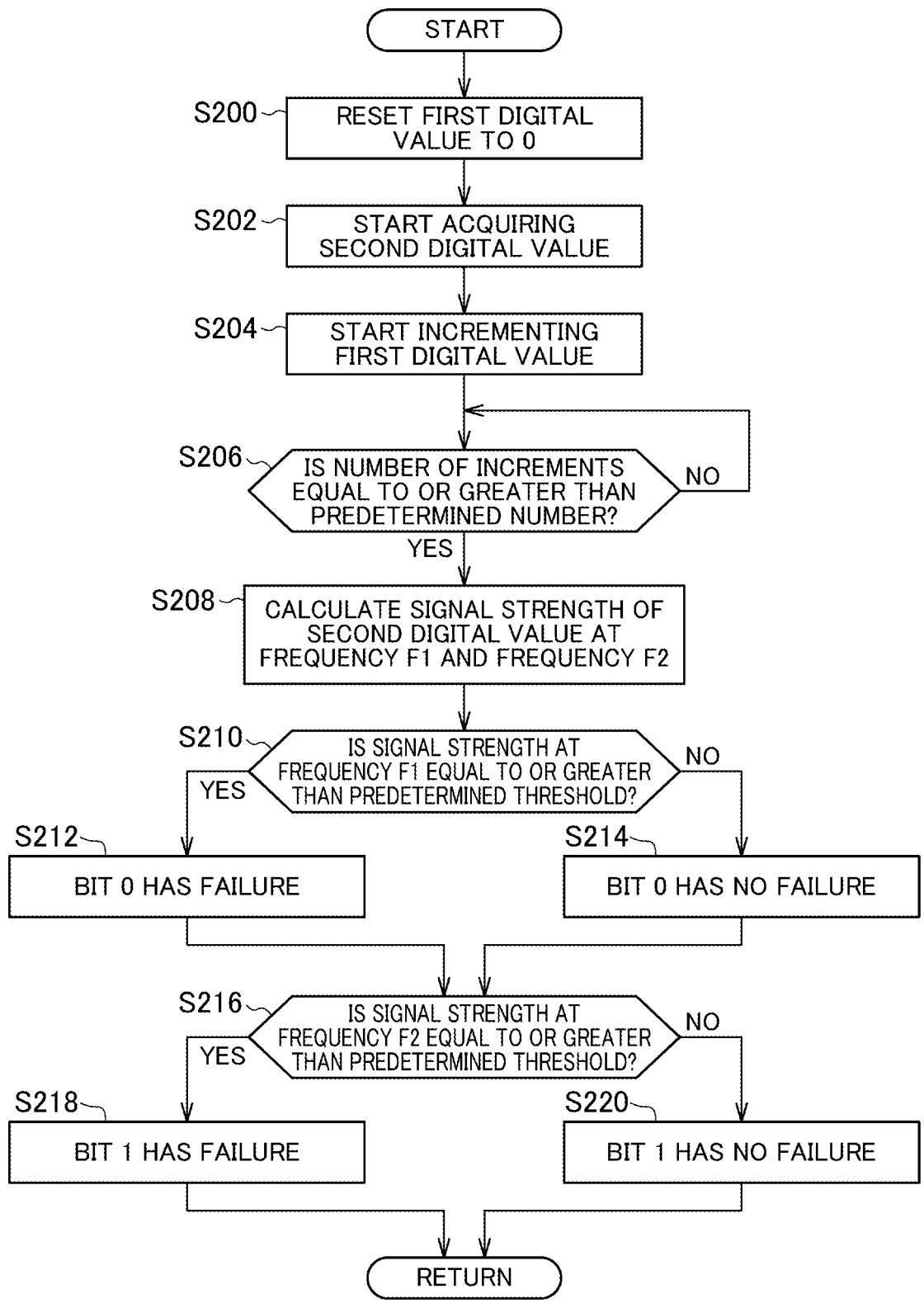
FIG. 6 is a flowchart showing a procedure of less significant bit determination processing shown in FIG. 5.

FIG. 6 is a flowchart showing the procedure of the less significant bit determination processing (S100) shown in FIG. 5.

When the processing starts, the output unit 24 first notifies the acquisition unit 25 and the diagnosis unit 26 of the start of the less significant bit determination processing, and then resets the first digital value, which is the input digital data to the DA conversion circuit 5, to 0 (S200). Next, the acquisition unit 25 starts acquiring the second digital value corresponding to the difference between the monitoring current Im output from the DA conversion circuit 5 and the target current It indicated by the first digital value (S202). After that, the acquisition unit 25 acquires the second digital value at the second time interval. The acquisition unit 25 stores the acquired second digital values in the memory 22 in chronological order.

Next, the output unit 24 starts incrementing the first digital value (S204). Thereafter, the output unit 24 increments the first digital value at first time intervals. Next, the output unit 24 determines whether the number of increments has reached a predetermined number or more (S206). Then, if the number of increments is less than the predetermined number (S206, NO), the output unit 24 repeats step S206. In contrast, if the number of increments is equal to or greater than the predetermined number (S206, YES), the diagnosis unit 26 calculates the signal strength of the AC component unit 26 with the predetermined frequency included in the discrete signal indicated by the second digital value stored in the memory 22 by the acquisition unit 25 (S208). In the present embodiment, the predetermined frequencies are the first frequency $F1=1/(\Delta t1 \times 2^1)$ Hz corresponding to a bit 0 failure and the second frequency $F2=1/(\Delta t1 \times 2^2)$ Hz corresponding to a bit 1 failure. The calculation of the signal strength is executed with, for example, Expression (3) described above.

Next, the diagnosis unit 26 determines whether the signal strength of the AC component with the first frequency F1 is equal to or greater than a predetermined threshold (S210). Then, if the signal strength of the AC component of the first frequency F1 is equal to or greater than the predetermined threshold (S210, YES), the diagnosis unit 26 determines that a bit 0 failure has occurred in the DA conversion circuit 5 (S212). In contrast, if the signal strength of the AC component with the first frequency F1 is less than the predetermined threshold (S210, NO), the diagnosis unit 26 determines that the bit 0 failure has not occurred in the DA conversion circuit 5 (S214).

Subsequently, the diagnosis unit 26 determines whether the signal strength of the AC component of the second frequency F2 is equal to or greater than a predetermined threshold (S216). Then, if the signal strength of the AC component with the second frequency F2 is equal to or greater than the predetermined threshold (S216, YES), the diagnosis unit 26 determines that a bit 1 failure has occurred in the DA conversion circuit 5 (S218). In contrast, if the signal strength of the AC component with the second frequency F2 is less than the predetermined threshold (S216, NO), the diagnosis unit 26 determines that the bit 1 failure has not occurred in the DA conversion circuit 5 (S220). After that, the diagnosis unit 26 ends the less significant bit determination processing.

FIG. 7 is a flowchart showing the procedure of the significant bit determination processing (S102) shown in FIG. 5. The diagnosis unit 26 transmits a notification of the start of the significant bit determination processing, to the output unit 24 and the acquisition unit 25, when the diagnosis unit 26 ends the less significant bit determination processing. This starts the significant bit determination processing.

When the significant bit determination processing starts, the output unit 24 first sets only one bit of the ten most significant bits of the first digital value, which are binary values, to 1 (S300). The one bit is selected from the ten most significant bits (i.e. bit 2 through bit 11) that have not been subjected to the determination of the bit failure. When the output unit 24 sets one of the ten most significant bits of the first digital value to 1, the output unit 24 transmits the first digital value to the acquisition unit 25 and the diagnosis unit 26.

Subsequently, in response to receiving the first digital value, the acquisition unit 25 acquires the second digital value corresponding to the difference between the monitoring current Im output by the DA conversion circuit 5 and the target current It indicated by the first digital value, for example, based on the output of the second AD conversion circuit 8 (S302). Next, the diagnosis unit 26 determines whether the second digital value acquired by the acquisition unit 25 is equal to or greater than a predetermined threshold determined corresponding to the first digital value received from the output unit 24 (S304).

If the second digital value is equal to or greater than the threshold (S304, YES), the diagnosis unit 26 determines that a bit failure has occurred with respect to the bit set to 1 in the DA conversion circuit 5 (S306) In contrast, if the second digital value is less than the threshold (S304, NO), the diagnosis unit 26 determines that no bit failure has occurred with respect to the bit set to 1 in the DA conversion circuit 5 (S308).

Subsequently, the diagnosis unit 26 determines whether it has determined whether there is any bit failure for all of the ten most significant bits of the first digital value (S310). Then, if the diagnosis unit 26 has determined whether there is any bit failure for all of the ten most significant bits of the first digital value (S310, YES), the diagnosis unit 26 ends the significant bit determination processing. In contrast, if the diagnosis unit 26 has not determined whether there is any bit failure for all of the ten most significant bits of the first digital value (S310, NO), the diagnosis unit 26 returns to step S300 and repeats the processing.

Other Embodiments

Although the bit length of the input digital data of the DA conversion circuit 5, which is the target of failure determination, is 12 bits in the above-described embodiment, the bit length may be any bit length other than 12 bits.

In addition, in the above-described embodiment, the less significant bit determination processing determines a bit failure with respect to the two least significant bits (bit 0 and bit 1) of the first digital value, which is the input digital data, in the DA conversion circuit 5. However, the failure determination may be performed with respect to one or more than two least significant bits.

The resistor 7b that converts the monitoring current Im into the monitoring voltage Vm has a fixed resistance value in the above-described embodiment. However, the resistance value may be adjustable corresponding to the first digital value given to the DA conversion circuit 5. Such adjustment of the resistance value can be performed by making the resistor 7b a variable resistor or by switching between a plurality of resistors 7b having different resistance values.

Further, a switch may be provided in the output line of the DA conversion circuit 5 to switch between the following two paths of the current: a path in which the current output from the DA conversion circuit 5 flows through the IP cell 2c of the air-fuel ratio sensor 2 to serve as the Ip current; and a path in which the current flows through the resistor 7b to serve as the monitoring current Im.

Further, although the first time interval is 40 ms in the above-described embodiment, it can be any other time interval. As the first time interval is shorter, the frequency corresponding to each bit failure of the less significant bits increases and the separation interval between the frequencies corresponding to each bit failure increases. Therefore, from the viewpoint of separating and identifying bits with a failure, it is preferable that the first time interval be short.

In the above-described embodiment, the control device 1 includes the controller 10 and the failure determination device 20, but the function of the failure determination device 20 may be implemented in the controller 10. In this case, for example, a processor (not shown) included in the controller 10 may implement the functional elements included in the processor 21 of the present embodiment.

Further, part or all of the reference potential generation circuit 3, the first AD conversion circuit 4, the DA conversion circuit 5, the resistors 7a and 7b, and the second AD conversion circuit 8 may be included in the control device 1.

Alternatively, the failure determination device 20 may be a device different from the control device 1.

In the present embodiment, the DA conversion circuit 5, for which the failure determination device 20 determines whether there is a failure, outputs the Ip current that flows through the IP cell 2c of the air-fuel ratio sensor 2, but the present invention is not limited to this. The configuration of the failure determination device 20 shown in the present disclosure can be similarly used in failure determination of any DA conversion circuit of a current output type or a voltage output type to be used for any purpose.

Configuration Supported by Above Embodiment

The above-described embodiments (and its modifications) support the following configurations.

(Configuration 1) A failure determination device, including: an output unit that inputs a first digital value to a digital-to-analog conversion circuit (DA conversion circuit) and causes the DA conversion circuit to generate an analog electrical output; an acquisition unit that acquires a second digital value corresponding to a difference between the analog electrical output of the DA conversion circuit and a target analog electrical output indicated by the first digital value; and a diagnosis unit that diagnoses a failure of the DA conversion circuit based on the second digital value, wherein the output unit increments the first digital value and inputs the first digital value to the DA conversion circuit at a first time interval, the acquisition unit acquires the second digital value at a second time interval that is shorter than the first time interval, and the diagnosis unit determines whether the DA conversion circuit has a failure based on signal strength of an alternating-current component (AC component) with a predetermined frequency included in a discrete signal that is the second digital value acquired at the second time interval.

According to the failure determination device of configuration 1, it is determined whether there is any failure of the DA conversion circuit based on the signal strength of the AC component with the predetermined frequency in the discrete signal, which is indicated by the second digital value corresponding to the difference between the analog electrical output of the DA conversion circuit and the target analog electrical output of the circuit. This makes it possible to detect the failure with high accuracy.

(Configuration 2) The failure determination device according to configuration 1, wherein the acquisition unit: samples the analog electrical output of the DA conversion circuit at the second time interval, to acquire the analog electrical output as a third digital value; and calculates the second digital value from a difference between the first digital value and the third digital value, and acquires the second digital value.

The failure determination device of configuration 2 makes it possible to easily acquire the second digital value corresponding to the difference between the analog electrical output of the DA conversion circuit and the target analog electrical output of the circuit.

(Configuration 3) The failure determination device according to configuration 1, wherein the diagnosis unit multiplies the discrete signal by a predetermined periodic function to calculate an enhanced signal strength of the AC component with the predetermined frequency, and the periodic function is a function that repeatedly takes three values of −1, 0, and +1 in sequence in one period.

The failure determination device of configuration 3 makes it possible to enhance the signal strength of the AC component with the predetermined frequency in the discrete signal indicated by the second digital value, to detect the failure of the DA conversion circuit more accurately.

(Configuration 4) The failure determination device according to any of configurations 1 to 3, wherein the predetermined frequency is at least one frequency corresponding to a period obtained by multiplying the first time interval by a power of 2.

The failure determination device of configuration 4 makes it possible to use a frequency determined corresponding to the first time interval for incrementing the first digital value input to the DA conversion circuit, to easily determine whether there is a bit failure with respect to a specific bit in the DA conversion circuit, based on the signal strength of the frequency in the discrete signal indicated by the second digital value.

(Configuration 5) The failure determination device according to configuration 4, wherein the predetermined frequency is a frequency corresponding to a period obtained by multiplying the first time interval by 2, and the diagnosis unit determines whether there is an operational failure with respect to a least significant bit of input digital data in the DA conversion circuit. The failure determination device of configuration 5 makes it is possible to easily determine whether there is a bit failure with respect to the least significant bit in the DA conversion circuit.

(Configuration 6) The failure determination device according to configuration 4 or 5, wherein the predetermined frequency is a frequency corresponding to a period obtained by multiplying the first time interval by 4, and the diagnosis unit determines whether there is an operational failure with respect to a second least significant bit of input digital data in the DA conversion circuit.

The failure determination device of configuration 6 makes it is possible to easily determine whether there is a bit failure with respect to the second least significant bit in the DA conversion circuit.

(Configuration 7) The failure determination device according to any of configurations 1 to 6, wherein the output unit sequentially sets only one of significant bits to 1, the significant bits being bits excluding a predetermined number of least significant bits of the first digital value that is a binary value, the acquisition unit acquires the second digital value when the output unit sets only one of the significant bits to 1, and the diagnosis unit determines that an operational failure has occurred with respect to the bit set to 1 in the DA conversion circuit when the second digital value acquired by the acquisition unit is equal to or greater than a predetermined threshold determined corresponding to the first digital value.

The failure determination device of configuration 7 makes it possible to accurately determine the bit failure in less significant bits and the bit failure in significant bits of a DA conversion circuit with different criteria suitable for each.

(Configuration 8) The failure determination device according to any of configurations 1 to 7, wherein the DA conversion circuit is a circuit to be used to generate a pump current that energizes a pump cell of an air-fuel ratio sensor.

The failure determination device of configuration 8 makes it possible to accurately detect the failure of the DA conversion circuit in the air-fuel ratio detection circuit including the air-fuel ratio sensor.

(Configuration 9) A control device including a failure determination device according to any of configurations 1 to 8.

The control device of configuration 9 makes it possible to accurately detect a failure of the DA conversion circuit in a control device including a DA conversion circuit.

(Configuration 10) A failure determination method for a DA conversion circuit executed by a computer of a failure determination device for the DA conversion circuit, the method including: a step of inputting a first digital value to the DA conversion circuit and causing the DA conversion circuit to generate an analog electrical output; a step of acquiring a second digital value corresponding to a difference between the analog electrical output of the DA conversion circuit and a target analog electrical output indicated by the first digital value; and a step of diagnosing a failure of the DA conversion circuit based on the second digital value, wherein the step of inputting increments the first digital value and input the incremented value to the DA conversion circuit at a first time interval, the step of acquiring acquires the second digital value at a second time interval, the second time interval being shorter than the first time interval, and the step of diagnosing determines whether the DA conversion circuit has a failure based on signal strength of an AC component with a predetermined frequency included in a discrete signal, the discrete signal being the second digital value acquired at the second time interval.

According to the failure determination method for the DA conversion circuit of configuration 10, it is determined whether there is any failure of the DA conversion circuit based on the signal strength of the AC component with the predetermined frequency in the discrete signal, which is indicated by the second digital value corresponding to the difference between the analog electrical output of the DA conversion circuit and the target analog electrical output of the circuit. This makes it possible to detect the failure with high accuracy.

REFERENCE SIGNS LIST

1 . . . control device, 2 air-fuel ratio sensor, 2a . . . gas chamber, 2b . . . VS cell, 2c . . . IP cell, 2d . . . heater, 3 . . . reference potential generation circuit, 4 . . . first AD conversion circuit, 5 . . . DA conversion circuit, 7a, 7b . . . resistor, 8 . . . second AD conversion circuit, 9 . . . heater driving circuit, 10 . . . controller, 20 . . . failure determination device, 21 . . . processor, 22 . . . memory, 23 . . . diagnostic program, 24 . . . output unit, 25 . . . acquisition unit 26 . . . diagnosis unit 30 . . . waveform 32, 34 . . . line.

What is claimed is:
1. A failure determination device, comprising:
an output unit that inputs a first digital value to a digital-to-analog conversion circuit (DA conversion circuit) and causes the DA conversion circuit to generate an analog electrical output;
an acquisition unit that acquires a second digital value corresponding to a difference between the analog electrical output of the DA conversion circuit and a target analog electrical output indicated by the first digital value; and
a diagnosis unit that diagnoses a failure of the DA conversion circuit based on the second digital value,
wherein the output unit increments the first digital value and inputs the first digital value to the DA conversion circuit at a first time interval, the acquisition unit acquires the second digital value at a second time interval that is shorter than the first time interval, and the diagnosis unit determines whether the DA conversion circuit has a failure based on signal strength of an alternating-current component (AC component) with a predetermined frequency included in a discrete signal that is the second digital value acquired at the second time interval.

2. The failure determination device according to claim 1, wherein the acquisition unit:

samples the analog electrical output of the DA conversion circuit at the second time interval, to acquire the analog electrical output as a third digital value; and calculates the second digital value from a difference between the first digital value and the third digital value, and acquires the second digital value.

3. The failure determination device according to claim 1, wherein the diagnosis unit multiplies the discrete signal by a predetermined periodic function to calculate an enhanced signal strength of the AC component with the predetermined frequency, and the periodic function is a function that repeatedly takes three values of −1, 0, and +1 in sequence in one period.

4. The failure determination device according to claim 1, wherein the predetermined frequency is at least one frequency corresponding to a period obtained by multiplying the first time interval by a power of 2.

5. The failure determination device according to claim 4, wherein the predetermined frequency is a frequency corresponding to a period obtained by multiplying the first time interval by 2, and the diagnosis unit determines whether there is an operational failure with respect to a least significant bit of input digital data in the DA conversion circuit.

6. The failure determination device according to claim 4, wherein the predetermined frequency is a frequency corresponding to a period obtained by multiplying the first time interval by 4, and the diagnosis unit determines whether there is an operational failure with respect to a second least significant bit of input digital data in the DA conversion circuit.

7. The failure determination device according to claim 1, wherein the output unit sequentially sets only one of significant bits to 1, the significant bits being bits excluding a predetermined number of least significant bits of the first digital value that is a binary value, the acquisition unit acquires the second digital value when the output unit sets only one of the significant bits to 1, and the diagnosis unit determines that an operational failure has occurred with respect to the bit set to 1 in the DA conversion circuit when the second digital value acquired by the acquisition unit is equal to or greater than a predetermined threshold determined corresponding to the first digital value.

8. The failure determination device according to claim 1, wherein the DA conversion circuit is a circuit to be used to generate a pump current that energizes a pump cell of an air-fuel ratio sensor.

9. A control device comprising a failure determination device according to claim 1.

10. A failure determination method for a DA conversion circuit executed by a computer of a failure determination device for the DA conversion circuit, the method comprising:

a step of inputting a first digital value to the DA conversion circuit and causing the DA conversion circuit to generate an analog electrical output;

a step of acquiring a second digital value corresponding to a difference between the analog electrical output of the DA conversion circuit and a target analog electrical output indicated by the first digital value; and a step of diagnosing a failure of the DA conversion circuit based on the second digital value, wherein the step of inputting increments the first digital value and inputs the incremented value to the DA conversion circuit at a first time interval, the step of acquiring acquires the second digital value at a second time interval, the second time interval being shorter than the first time interval, and the step of diagnosing determines whether the DA conversion circuit has a failure based on signal strength of an AC component with a predetermined frequency included in a discrete signal, the discrete signal being the second digital value acquired at the second time interval.

* * * * *